(12) United States Patent
Shibagaki et al.

(10) Patent No.: US 8,187,958 B2
(45) Date of Patent: May 29, 2012

(54) SUBSTRATE PROCESSING METHOD AND METHOD OF MANUFACTURING CRYSTALLINE SILICON CARBIDE (SIC) SUBSTRATE

(75) Inventors: Masami Shibagaki, Fuchu (JP); Masataka Satoh, Sagamihara (JP); Akemi Satoh, legal representative, Sagamihara (JP); Takahiro Sugimoto, Yokohama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/234,594

(22) Filed: Sep. 16, 2011

(65) Prior Publication Data

US 2012/0070968 A1    Mar. 22, 2012

Related U.S. Application Data

(63) Continuation of application No. PCT/JP2010/054437, filed on Mar. 16, 2010.

(30) Foreign Application Priority Data

Mar. 26, 2009    (JP) .................................. 2009-076313

(51) Int. Cl.
*H01L 21/265* (2006.01)
(52) U.S. Cl. ....................... 438/522; 438/931
(58) Field of Classification Search .......................... None
See application file for complete search history.

(56) References Cited

U.S. PATENT DOCUMENTS

| 6,294,444 | B1 | 9/2001 | Ueno |
| 2005/0001217 | A1 | 1/2005 | Kusumoto et al. |
| 2007/0284337 | A1 | 12/2007 | Mochizuki et al. |
| 2009/0104762 | A1 | 4/2009 | Kusumoto et al. |
| 2010/0025695 | A1 | 2/2010 | Shibagaki et al. |
| 2011/0121317 | A1 | 5/2011 | Shibagaki et al. |

FOREIGN PATENT DOCUMENTS

| JP | 2000-036470 A | 2/2000 |
| JP | 2001-35838 A | 2/2001 |
| JP | 2004-363326 A | 12/2004 |
| JP | 2005-39257 A | 2/2005 |
| JP | 2005-260267 A | 9/2005 |
| JP | 2007-273866 A | 10/2007 |
| WO | 2008/136126 A1 | 11/2008 |

OTHER PUBLICATIONS

M. A. Capano et al., "Surface Roughening in Ion Implanted 4H-Silicon Carbide," 28(3) J. Electron. Mater. 214-218 (Mar. 1999).

*Primary Examiner* — Scott B Geyer
(74) *Attorney, Agent, or Firm* — Fitzpatrick, Cella, Harper & Scinto

(57) ABSTRACT

The present invention provides a method of processing a substrate and a method of manufacturing a silicon carbide (SiC) substrate in which, when annealing processing is performed on a crystalline silicon carbide (SiC) substrate, the occurrence of surface roughness is suppressed. A substrate processing method according to an embodiment of the present invention includes a step of performing plasma irradiation on a single crystal silicon carbide (SiC) substrate (1) and a step of performing high temperature heating processing on the single crystal silicon carbide (SiC) substrate (1) in which the plasma irradiation is performed.

12 Claims, 7 Drawing Sheets

SUBSTRATE PROCESSING METHOD AND METHOD OF MANUFACTURING CRYSTALLINE SILICON CARBIDE (SIC) SUBSTRATE

CROSS-REFERENCES TO RELATED APPLICATIONS

This application is a continuation application of International Application No. PCT/JP2010/054437, filed Mar. 16, 2010, which claims the benefit of Japanese Patent Application No. 2009-076313, filed Mar. 26, 2009. The contents of the aforementioned applications are incorporated herein by reference in their entities.

TECHNICAL FIELD

The present invention relates to a method of preprocessing a crystalline silicon carbide (SiC) substrate such as of single crystal silicon carbide (SiC) and a method of manufacturing the crystalline silicon carbide (SiC) substrate. More particularly, the present invention relates to a technology for acquiring surface flatness by preprocessing in a method of heat-treating the substrate.

BACKGROUND ART

In order to electrically activate an impurity implanted into a single crystal silicon carbide (SiC) substrate, an activation annealing processing process is performed at a high temperature. However, when the impurity in the silicon carbide (SiC) substrate is subjected to activation annealing, the surface roughness of the substrate disadvantageously occurs.

As methods of solving this problem, a method of adding a silane ($SiH_4$) gas to perform annealing (see non-patent document 1), a method of applying a carbon coating to a substrate to be processed to perform annealing (see patent document 1) and a method of performing annealing under an atmosphere in which the partial pressure of the remaining water is reduced in a high vacuum region (see patent document 2) are known. Patent document 3 discloses that an epitaxial layer is formed on a substrate, an ion implantation layer is formed on a surface of the epitaxial layer, high temperature annealing for the activation of an impurity is performed and thereafter the surface (the surface of the ion implantation layer) of the single crystal silicon carbide (SiC) substrate is subjected to plasma etching using plasma.

[Patent document 1] Japanese Patent Application Laid-open No. 2005-39257
[Patent document 2] International Publication No. 08/136,126 Pamphlet
[Patent document 3] Japanese Patent Application Laid-open No. 2001-35838
[Non-patent document 1] M. A. Capano, S. Ryu, J. A. Cooper, J R., M. R. Melloch, K. Rottner, S. Karlsson, N. Nordell, A. Powell. and D. E. Walker: J. Electron. Mater, P214-218, Vol. 28, No. 3. (1999)

SUMMARY OF INVENTION

However, in the substrate heat treatment device and the heat treatment method described in non-patent document 1, since it is very difficult to control additive amount of silane ($SiH_4$) gas, there is such a problem that a droplet (liquefied and aggregated silicon) of silicon (Si) may occur, or that the change in the amount of water brought from the substrate makes it difficult to ensure reproducibility of maintaining surface flatness of a silicon carbide (SiC) sample after activation annealing.

In the substrate heat treatment device disclosed in patent document 1, since a substrate to be processed is coated with a resist and is carbonized in a special high-temperature furnace, and thus the substrate to be processed is carbon-coated, the number of processes is increased, and there is a concern of contamination by heavy metals from the resist.

The technology disclosed in patent document 2 is an effective technology in that the partial pressure of the remaining water under an annealing atmosphere is controlled during the annealing and thus it is possible to reduce the surface roughness (RMS value) of the substrate, that is, the surface flatness of silicon carbide (SiC); the technology sufficiently achieved electrical activation required in those times. However, in consideration of enhancement of yield and the like, it is desirable to achieve further enhanced surface flatness.

In the substrate heat treatment method disclosed in patent document 2, when aluminum (Al) is implanted as an impurity, a very high temperature of about 1900° C. is required to achieve an activation rate of 100%; in this case, step bunching is not observed but holes such as pits may be locally produced, and this may cause a leak in a pn junction.

In the technology disclosed in patent document 3, high temperature annealing processing for activating the implanted impurity is performed, and thereafter step bunching and protrusions and recesses formed in the surface of the substrate (the surface of an ion implantation layer), abnormal deposition materials deposited on the surface of the substrate or portions whose compositions have been changed are physically removed by plasma etching. In patent document 3, the surface of the substrate is removed by plasma etching with a thickness of 120 nm or 0.1 μm.

In the technology disclosed in patent document 3, in order to achieve the technological purpose of removing effects after the annealing such as abnormal deposition materials on the SiC surface, composition change, the change in the shape of the surface (surface flatness) and the like, it is necessary to remove, by etching, part of the surface (the surface where the change in the shape of the surface or the like is produced) of the ion implantation layer that is the surface layer of the SiC substrate. Hence, if the thickness of the ion implantation region (an impurity region) is not increased, the ion implantation region that has been formed with difficulty may disappear. In other words, when the impurity region has a small thickness, the entire ion implantation region may be cut.

Therefore, in patent document 3, it is necessary to form the ion implantation region thicker than the thickness of the necessary ion implantation region, by a thickness corresponding to a portion removed by the plasma etching. In other words, it is necessary to form the ion implantation region that has not only an originally required amount (thickness) but also an extra thickness; in consideration of cost and yield, it is required to achieve the flatness of the surface of the single crystal silicon carbide (SiC) substrate while reducing the amounts of epitaxial layer and impurity used for formation of the extra ion implantation region.

The present invention is made in view of the foregoing problem; an object of the present invention is to provide a method of processing a substrate in which, when a crystalline silicon carbide (SiC) substrate is subjected to annealing processing, the occurrence of the surface roughness is suppressed and a method of manufacturing the silicon carbide (SiC) substrate.

To achieve the above object, the present invention is a method of processing a crystalline silicon carbide (SiC) substrate, and the method includes: a step of performing plasma irradiation using a gas containing at least one of an inert gas and a fluorine based gas on the crystalline silicon carbide (SiC) substrate in which an impurity atom is ion-implanted; and a step of performing high temperature heating processing on the crystalline silicon carbide (SiC) substrate on which the plasma irradiation is performed.

Further, the present invention is a method of manufacturing a crystalline silicon carbide (SiC) substrate, and the method includes: a step of preparing a crystalline silicon carbide (SiC) substrate in which a predetermined impurity atom is ion-implanted; a step of performing plasma irradiation using a gas containing at least one of an inert gas and a fluorine based gas on the crystalline silicon carbide (SiC) substrate; and a step of performing high temperature heating processing on the crystalline silicon carbide (SiC) substrate on which the plasma irradiation is performed.

Furthermore, the present invention is a method of processing a crystalline silicon carbide (SiC) substrate, and the method includes: a step of performing plasma irradiation on the crystalline silicon carbide (SiC) substrate so as to remove at least part of a substance, other than the crystalline silicon carbide (SiC) substrate, the substance being present on a surface of the crystalline silicon carbide (SiC) substrate; and a step of performing high temperature heating processing on the crystalline silicon carbide (SiC) substrate on which the plasma irradiation is performed.

Still further, the present invention is a method of manufacturing a crystalline silicon carbide (SiC) substrate, and the method includes: a step of preparing a crystalline silicon carbide (SiC) substrate in which a predetermined impurity atom is ion-implanted; a step of performing plasma irradiation on the crystalline silicon carbide (SiC) substrate so as to remove at least part of a substance, other than the crystalline silicon carbide (SiC) substrate, the substance being present on a surface of the crystalline silicon carbide (SiC) substrate; and a step of performing high temperature heating processing on the crystalline silicon carbide (SiC) substrate on which the plasma irradiation is performed.

According to the substrate processing method and the method of manufacturing the crystalline silicon carbide (SiC) substrate of the present invention, when the high temperature heating processing (for example, annealing processing) is performed on the crystalline silicon carbide (SiC) substrate, it is possible to reduce the surface roughness on the crystalline silicon carbide (SiC) substrate on which the high temperature heating processing is performed.

DESCRIPTION OF EMBODIMENTS

An embodiment of the present invention will be described in detail below. Components described in the embodiment are only illustrative; the technical scope of the present invention is defined by claims and is not limited by the embodiment below.

Figure 1:
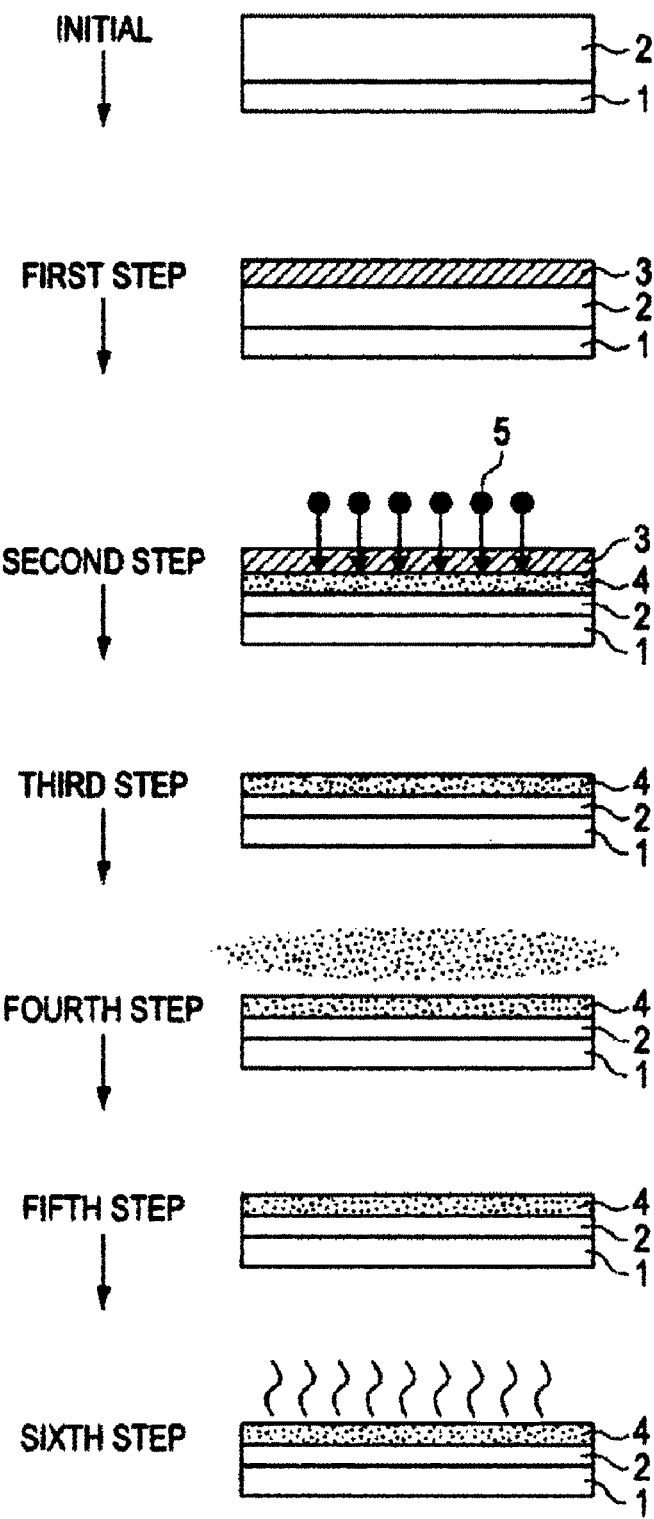
FIG. 1 is a diagram showing a substrate processing method according to an embodiment of the present invention.

An example of a substrate processing method according to the present invention will be described with reference to FIG. 1.

(Substrate Processing Method 1)

As a substrate of single crystal silicon carbide (SiC), a sample substrate obtained by growing a p-type SiC epitaxial layer 10 micrometers by CVD on a single crystal silicon carbide (4H—SiC (0001)) substrate is RCA-washed and is then used. Hence, in the initial step of FIG. 1, a single crystal silicon carbide (SiC) substrate 1 on which a p-type SiC epitaxial layer 2 is formed is prepared.

The first step is a step of forming a buffer layer 3 on a single region including the surface of the p-type SiC epitaxial layer 2. A silicon oxide ($SiO_2$) buffer layer 3 of ion implantation is formed by conducting sacrificial oxidation under an atmosphere of dry oxygen ($O_2$) at a temperature of 1150° C. for 30 minutes such that an oxide film is 10 nm thick.

The second step is a step of implanting nitrogen ($N^+$) ions 5 as an impurity atom into an ion implantation region 4 of the single crystal silicon carbide (SiC) substrate. The ion implantation is performed at room temperature at multiple stages of implantation energy of 15 keV to 120 keV to achieve a box profile on condition that the amount of implantation is $4 \times 10^{19}/cm^3$ and the depth is 250 nm.

Instead of nitrogen (N), the impurity atoms to be implanted may be any of phosphorus (P), aluminum (Al) and boron (B).

In the third step, the silicon oxide ($SiO_2$) layer that is the buffer layer 3 is removed by hydrofluoric acid.

The fourth step is a step of irradiating plasma to the surface of the single crystal silicon carbide (SiC) substrate (the ion implantation region 4). The plasma irradiation is performed by an inductively coupled plasma (ICP) etcher using argon (Ar) gas, a mixed gas of argon (Ar) gas and carbon tetrafluoride ($CF_4$) gas or carbon tetrafluoride ($CF_4$) gas. Here, the plasma irradiation is preferably performed such that the etched amount (SiC etching amount) is 20 nm or less.

In the fifth step, the single crystal silicon carbide (SiC) substrate on which the plasma irradiation has been performed in the fourth step is cleaned (washed) by RCA washing.

The sixth step is a step of performing high temperature heating processing (activation annealing processing) on the single crystal silicon carbide (SiC) substrate on which the plasma irradiation has been performed. In this step, the activation annealing processing is performed on the single crystal silicon carbide (SiC) substrate 1 having the p-type SiC epitaxial layer 2 on which the plasma irradiation has been performed in the fourth step and the ion implantation region 4 has been formed either in a high-frequency induction heating furnace at a temperature of 1700° C. for ten minutes or in an electron bombardment vacuum heating device at a high temperature of 1900° C. for one minute.

By the manufacturing method described above, in the embodiment of the present invention, it is possible to manufacture the single crystal silicon carbide (SiC) substrate in which surface roughness and the formation of pits are suppressed.

Although, in the present embodiment, as the method of plasma irradiation in the fourth step, the ICP etcher is used, the present invention is not limited to this method. As long as a method of generating plasma is used, any method may be used such as a capacitive coupling type using a parallel plate method, a microwave excitation type or an RF downstream type.

Although, in the present embodiment, as the high temperature heating method in step 6, examples of the high-frequency induction heating method and the electron bombardment vacuum heating method are described, as long as a method in which heating processing such as annealing processing can be performed is used, any heating method may be used such as an infrared heating method, a hybrid heating method of infrared heating and high-frequency induction heating or a resistance heating method.

Although, in the first and fourth steps, the RCA washing is performed, the washing is not limited to the RCA washing. If it is not necessary, the washing may be omitted.

(Substrate Processing Method 2)

Another example of the substrate processing method according to the present invention will be described.

In the present embodiment, the first step (the formation of the buffer layer) and the third step (the removal of the buffer layer) of the substrate processing method 1 are omitted.

Example 1

By the substrate processing method 1, the substrate processing method of the single crystal silicon carbide (SiC) substrate was performed. The plasma irradiation by the inductively coupled plasma (ICP) etcher in the fourth step was performed using a mixed gas of argon (Ar) gas and carbon tetrafluoride ($CF_4$) gas under conditions shown in table 1.

TABLE 1

| | |
|---|---|
| RF power of an upper coil | 400 W |
| Substrate bias | 150 W |
| $CF_4$ gas flow rate | 30 sccm |
| Ar gas flow rate | 20 sccm |
| Etching pressure | 0.2 Pa |
| Plasma irradiation period | 10 seconds |
| SiC etching amount | 20 nm |

In the high temperature heating processing in the fifth step, the activation annealing processing was performed using a high-frequency induction heating furnace at a temperature of 1700° C. for ten minutes.

The surface roughness (RMS value: root mean square value) of the obtained substrate was measured using an atomic force microscope (AFM: atomic force microscopy). The measurement was performed in a damping force mode over a measurement area of 4 micrometers×4 micrometers.

Figure 4:
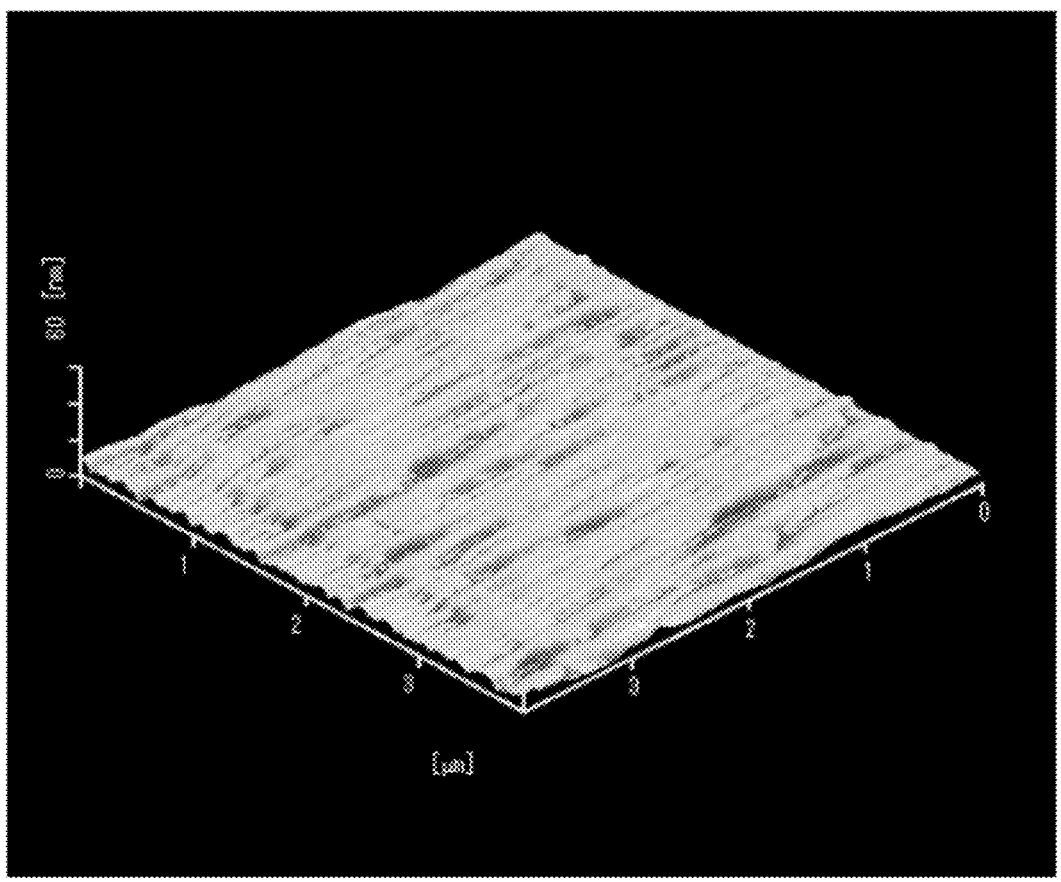
FIG. 4 is a surface observation diagram after annealing processing in example 1 of the present invention.

FIG. 4 is a surface observation diagram after annealing processing in the present example. When the surface roughness was observed by AFM, the RMS value was 1.6 nm; it has been found that the preprocessing by the plasma irradiation before the annealing processing has the effect of reduction in the surface roughness when the high temperature processing is performed on the single crystal silicon carbide (SiC) (FIG. 4).

As described above, in the present example, it has been found from table 1 and FIG. 4 that even when the amount of etching by the plasma irradiation before the annealing processing is 20 nm, it is possible to reduce the surface roughness. It is therefore possible to reduce the amount of etching of the ion implantation region formed on the single crystal silicon carbide (SiC) substrate and to reduce the formation of the extra ion implantation region.

The surface roughness (RMS) was measured with the following device.

Atomic force microscope (AFM: atomic force microscopy)
NPX200M0001 made by Seiko Instruments Inc.
Observation head NPX200
Controller Nanopics 2100
Scanning in a damping force mode (DFM)
(in the mode in which the distance between a cantilever and a specimen surface is controlled such that a probe vibrating cyclically at a constant amplitude is brought close to a substrate specimen surface, and that the amount of reduction of the amplitude is constant)

Example 2

In order to reduce the amount of etching of the silicon carbide (SiC) substrate by the plasma irradiation, the substrate processing was performed under conditions shown in table 2, instead of using the plasma conditions of the inductively coupled plasma (ICP) etcher in the fourth step in example 1.

TABLE 2

| | |
|---|---|
| RF power of the upper coil | 400 W |
| Substrate bias | 0 W |
| $CF_4$ gas flow rate | 30 sccm |
| Ar gas flow rate | 20 sccm |
| Etching pressure | 0.2 Pa |
| Plasma irradiation period | 60 seconds |
| SiC etching amount | 0 nm |

Figure 5:
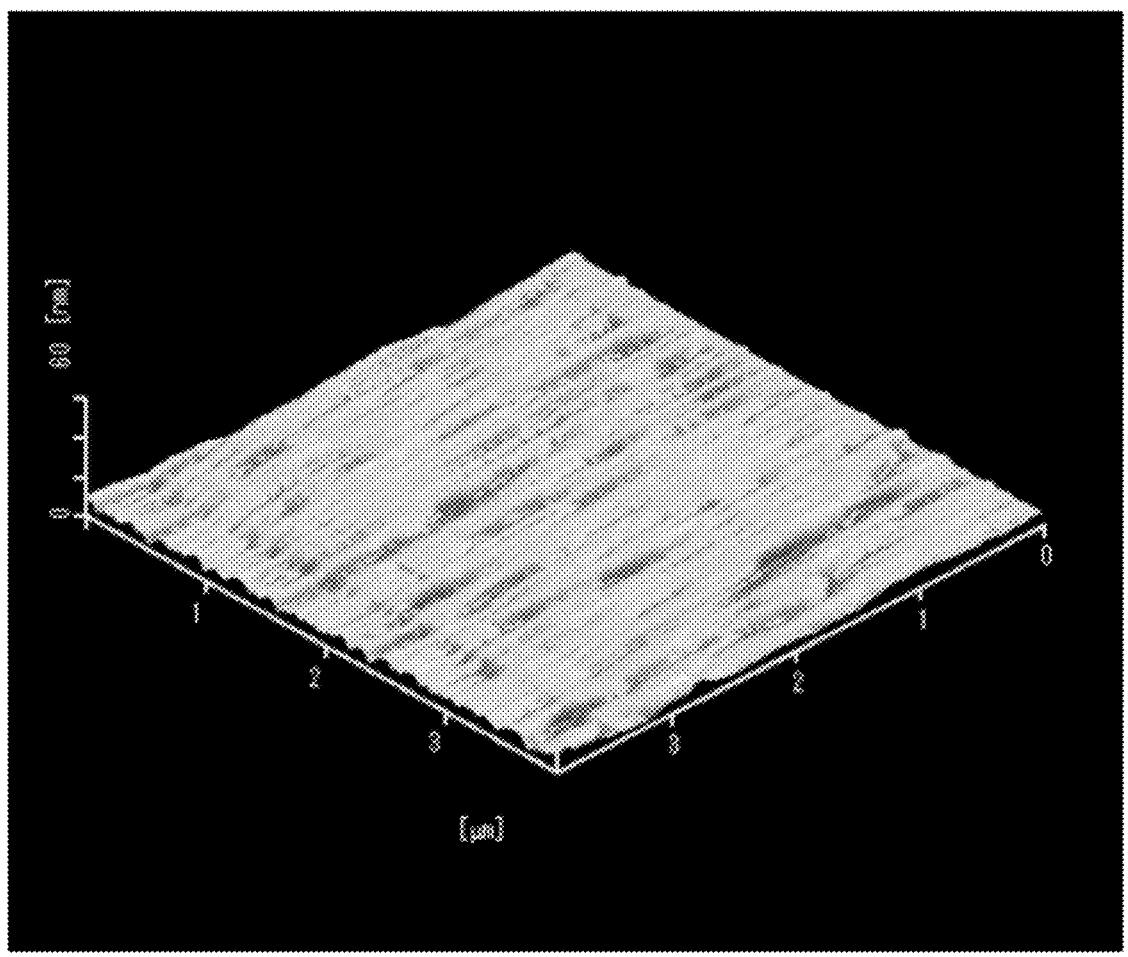
FIG. 5 is a surface observation diagram after annealing processing in example 2 of the present invention.

FIG. 5 is a surface observation diagram after annealing processing in the present example. When the surface roughness was observed by AFM, the RMS value was 1.6 nm; it has been found that the preprocessing by the plasma irradiation before the annealing process has the effect of reduction in the surface roughness when the high temperature processing is performed on the single crystal silicon carbide (SiC) (FIG. 5).

As described above, in the present example, it has been found from table 2 and FIG. 5 that even when the amount of etching by the plasma irradiation performed before the annealing processing is 0 nm, it is possible to reduce the surface roughness. It is therefore possible to reduce the surface roughness without the actual formation of the extra ion implantation region.

Example 3

In order to evaluate the flow rate ratio of a process gas by the plasma irradiation, the substrate processing was performed under conditions shown in table 3, instead of using the plasma irradiation conditions by the inductively coupled plasma (ICP) etcher in the fourth step in example 1.

TABLE 3

| | |
|---|---|
| RF power of the upper coil | 400 W |
| Substrate bias | 0 W |
| $CF_4$ gas flow rate | 0 sccm |
| Ar gas flow rate | 20 sccm |
| Etching pressure | 0.2 Pa |
| Plasma irradiation period | 60 seconds |
| SiC etching amount | 0 nm |

Figure 6:
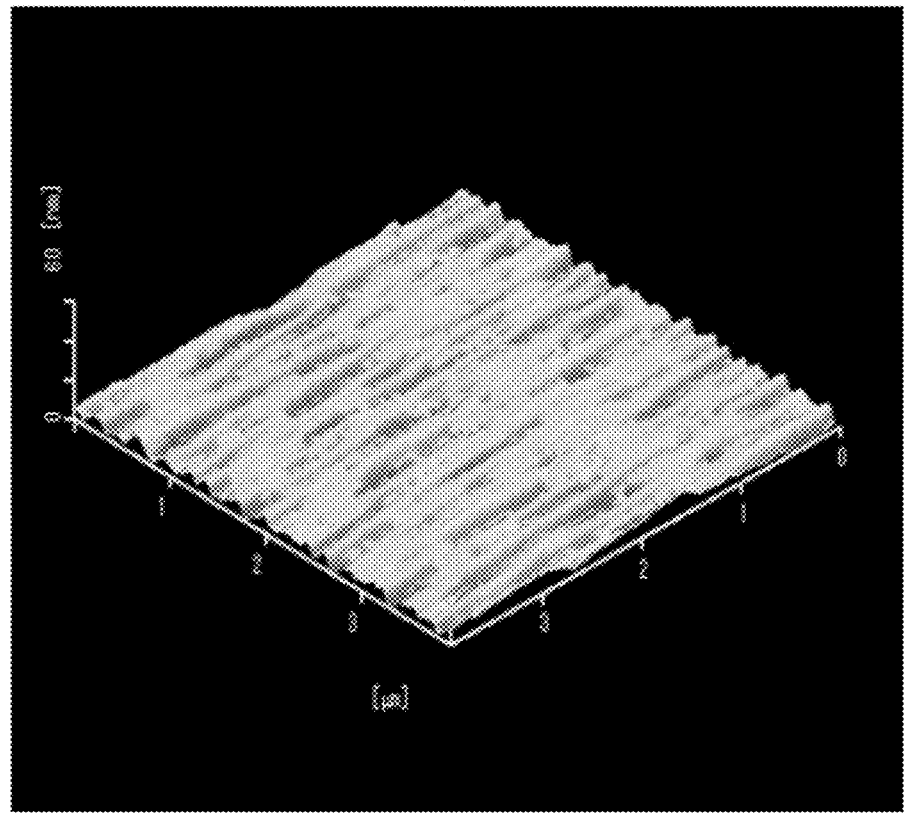
FIG. 6 is a surface observation diagram after annealing processing in example 3 of the present invention.

FIG. 6 is a surface observation diagram after annealing processing in the present example. When the surface roughness was observed by AFM, the RMS value was 2.1 nm; it has been found that, although the preprocessing by the plasma irradiation before the annealing processing with only the argon (Ar) gas has a small effect as compared with the case where the carbon tetrafluoride ($CF_4$) gas was added, the preprocessing has the effect of reduction in the surface roughness when the high temperature processing is performed on the single crystal silicon carbide (SiC) (FIG. 6).

As described above, in the present example, it has been found from table 3 and FIG. 6 that even when the amount of etching by the plasma irradiation performed before the annealing processing is 0 nm, it is possible to reduce the surface roughness. It is therefore possible to reduce the surface roughness without the actual formation of the extra ion implantation region.

Example 4

Furthermore, in order to evaluate the process gas flow rate ratio in the plasma irradiation, the substrate processing was performed under conditions shown in table 4, instead of using the plasma irradiation conditions by the inductively coupled plasma (ICP) etcher in the fourth step in example 1.

TABLE 4

| | |
|---|---|
| RF power of the upper coil | 400 W |
| Substrate bias | 0 W |
| $CF_4$ gas flow rate | 30 sccm |
| Ar gas flow rate | 0 sccm |
| Etching pressure | 0.2 Pa |
| Plasma irradiation period | 60 seconds |
| SiC etching amount | 0 nm |

Figure 7:
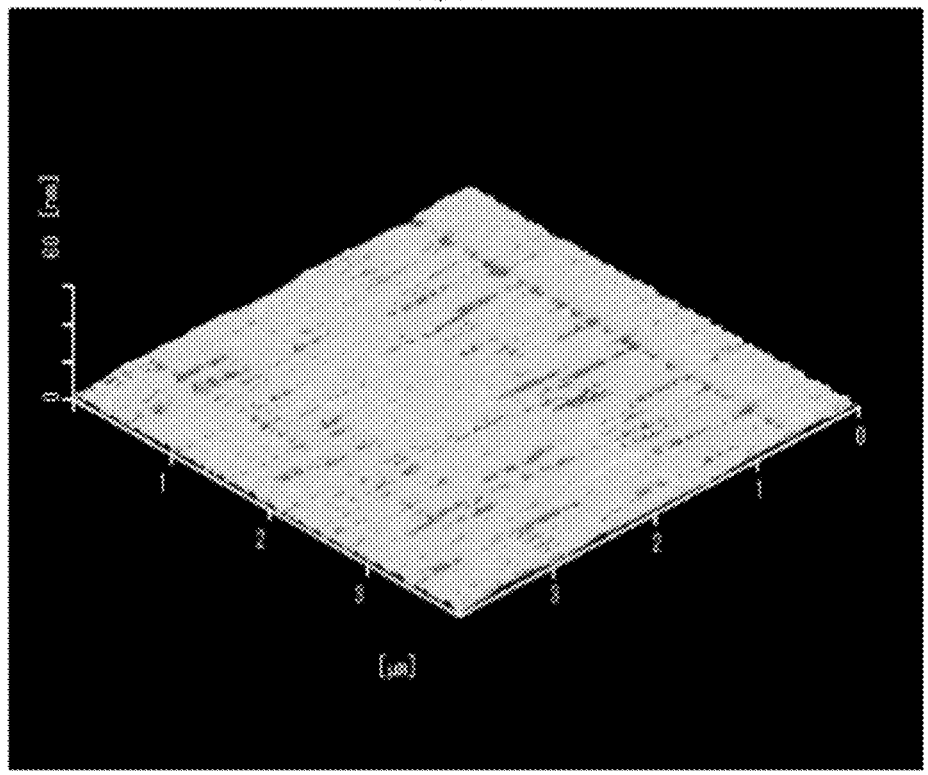
FIG. 7 is a surface observation diagram after annealing processing in example 4 of the present invention.

FIG. 7 is a surface observation diagram after annealing processing in the present example. When the surface roughness was observed by AFM, the RMS value was 0.9 nm; it has been found that, the plasma irradiation before the annealing processing with only the carbon tetrafluoride ($CF_4$) gas has the significant effect of reduction in the surface roughness when the high temperature processing is performed on the single crystal silicon carbide (SiC) (FIG. 7).

As described above, in the present example, it has been found from table 4 and FIG. 7 that even when the amount of etching by the plasma irradiation performed before the annealing processing is 0 nm, it is possible to reduce the surface roughness. It is therefore possible to reduce the surface roughness without the actual formation of the extra ion implantation region.

Example 5

In order to evaluate the effect obtained by performing the high temperature heating processing using the electron bombardment heating method under a vacuum atmosphere, the same substrate processing as in example 4 was performed instead of performing the high temperature heating processing in the fifth step using the electron bombardment heating device under a vacuum of $1 \times 10^{-3}$ Pa at a temperature of 1900° C. for one minute.

Figure 8:
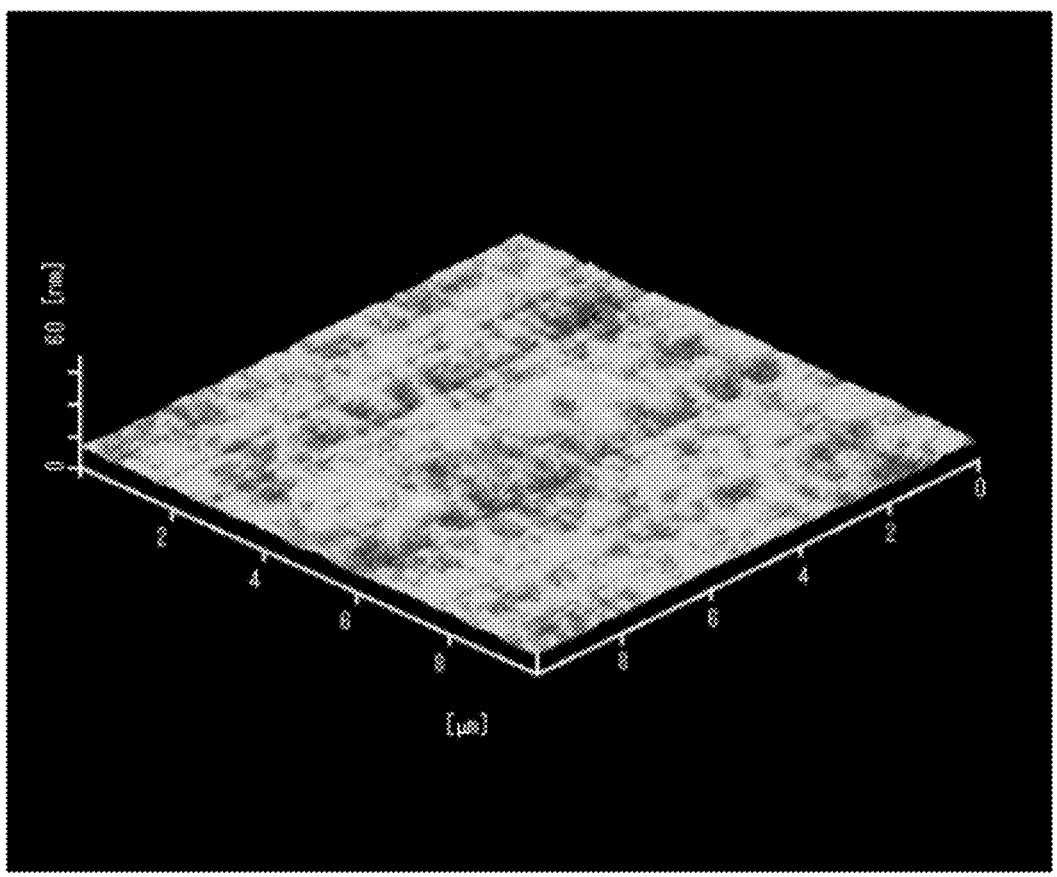
FIG. 8 is a surface observation diagram after annealing processing in example 5 of the present invention.

FIG. 8 is a surface observation diagram after annealing processing in the present example. When the surface roughness was observed by AFM, the RMS value was 0.80 nm, and no minute pit was observed (FIG. 8). It has been found that, the plasma irradiation with only the carbon tetrafluoride ($CF_4$) gas has the significant effect of reduction in the surface roughness when the high temperature processing is performed on the single crystal silicon carbide (SiC).

As described above, in the present example, it has been found from table 4 and FIG. 8 that even when the amount of etching by the plasma irradiation performed before the annealing processing is 0 nm, it is possible to reduce not only the surface roughness but also the generation of pits. It is therefore possible to reduce the surface roughness and the generation of pits without the actual formation of the extra ion implantation region.

Comparative Example 1

The processing on the silicon carbide (SiC) substrate was performed in the same method as in example 1 except that the fourth step (the plasma irradiation) was not performed.

Figure 2:
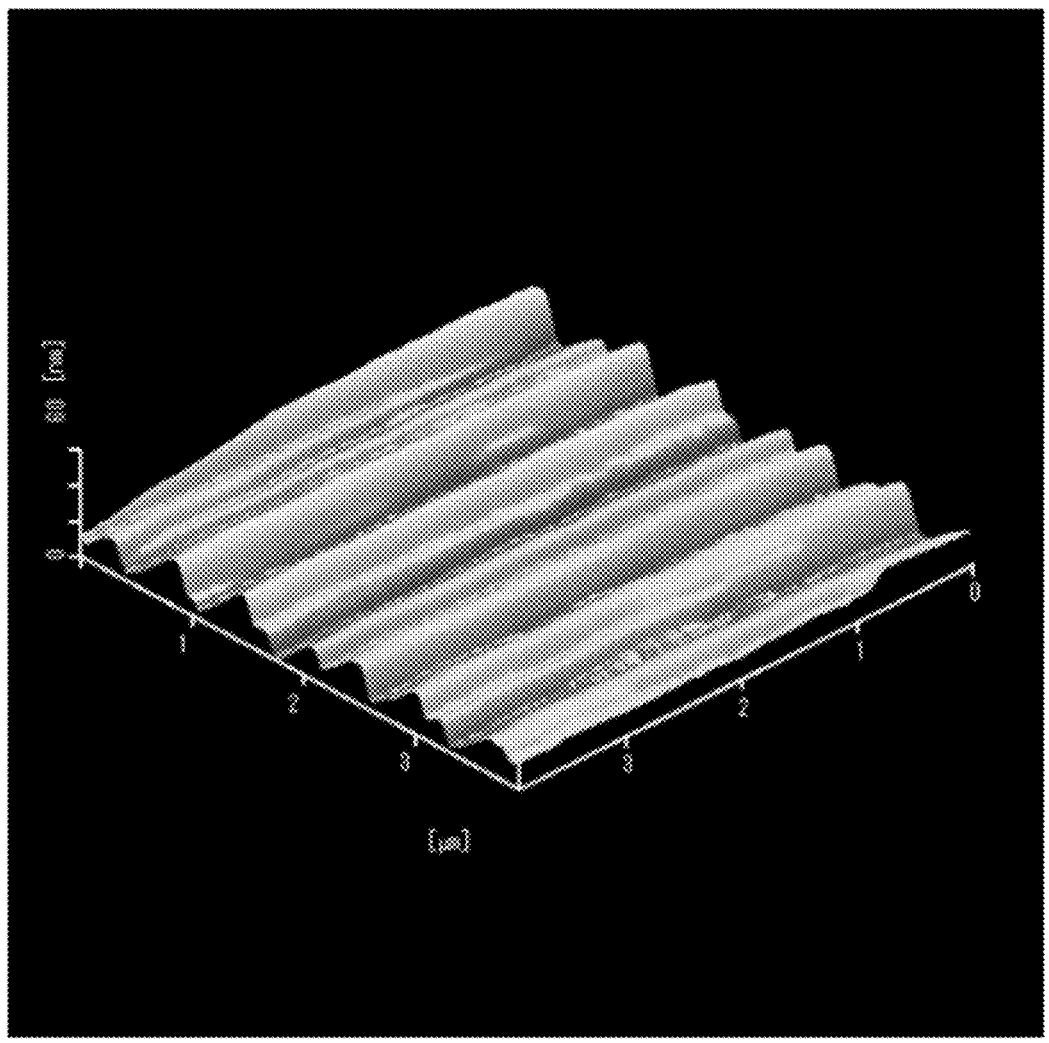
FIG. 2 is a surface observation diagram after annealing processing in comparative example 1 of the present invention.

FIG. 2 is a surface observation diagram after annealing processing in comparative example 1. As is obvious from an AFM image shown in FIG. 2, in comparative example 1, the RMS value indicating the surface roughness was 6.6 nm, and step bunching that was significant surface roughness was observed.

Comparative Example 2

The processing on the silicon carbide (SiC) substrate was performed in the same method as in example 5 except that the fourth step (the plasma irradiation) was not performed.

Figure 3:
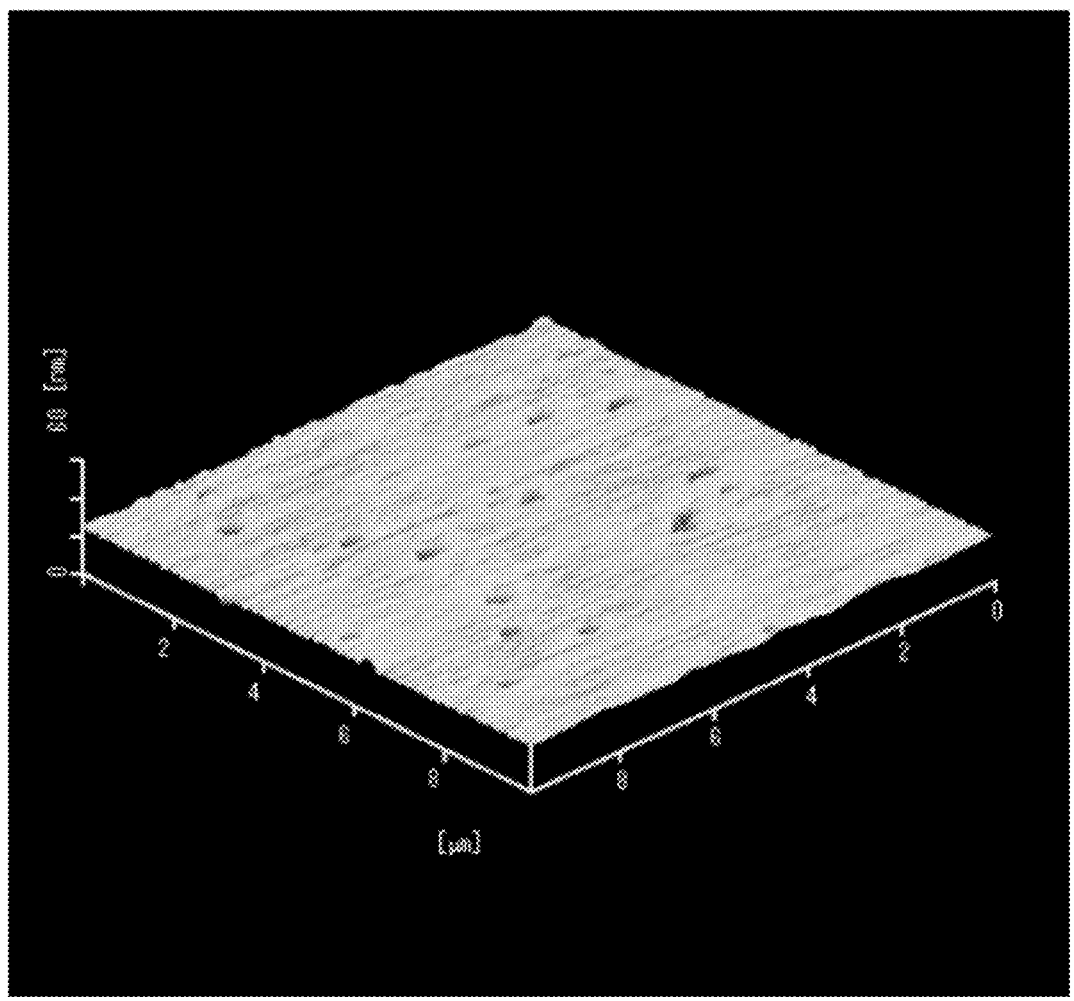
FIG. 3 is a surface observation diagram after annealing processing in comparative example 2 of the present invention.

FIG. 3 is a surface observation diagram after annealing processing in comparative example 2. As is obvious from an AFM image shown in FIG. 3, in comparative example 2, the RMS value indicating the surface roughness was reduced to 1.57 nm and no step bunching was observed but 23 minute pits were observed.

As is obvious from examples 1 to 5 and comparative examples 1 and 2 above, in the embodiment of the present invention, the plasma irradiation is performed on the single crystal silicon carbide (SiC) substrate before the high temperature heating processing (for example, annealing processing) is performed on the single crystal silicon carbide (SiC), and thus it is possible to reduce the surface roughness and the formation of pits. Since, as described above, in the embodiment of the present invention, it is possible to reduce not only the surface roughness but also the formation of pits, it is possible to reduce the occurrence of a leak in a pn junction and enhance yield in the manufacturing of the silicon carbide (SiC) substrate. The plasma irradiation is preferably performed using at least one of an inert gas such as argon (Ar) and a fluorine based gas such as carbon tetrafluoride ($CF_4$).

Example 6

The same substrate processing as in example 1 was performed except that, instead of the silicon carbide (4H—SiC (0001)) substrate having the epitaxial layer 2 formed by epitaxial growth, as a substrate, the single crystal silicon carbide (4H—SiC (0001)) substrate was used. When the substrate was compared with a substrate obtained by performing the substrate processing method in which the plasma irradiation in step 4 was excluded, it is possible to reduce the surface roughness.

Example 7

The substrate processing was performed by the substrate processing method 2. When the substrate was compared with a substrate obtained by performing the substrate processing method in which the plasma irradiation was not performed, the surface roughness was reduced.

As described above, according to the present invention, with the preprocessing by the plasma irradiation, it is possible to reduce the surface roughness and the generation of pits caused when the high temperature heating processing is performed on the single crystal silicon carbide (SiC) or the silicon carbide (SiC) obtained by epitaxial growth on the single crystal silicon carbide (SiC) substrate. Thus, it is possible to enhance yield of the silicon carbide (SiC) device.

The reason why performing the plasma irradiation before the high temperature heating processing such as the annealing processing reduced the surface roughness and the generation of pits is not clear; this is probably because impurities such as silicon oxide carbide (SiOC) and the like adhering to or formed on the substrate are removed by the plasma irradiation, and thereby the facilitation of a surface chemical reaction by the impurities at the time of high temperature heating was suppressed.

Anyway, when the impurity implanted into the single crystal silicon carbide (SiC) substrate is electrically activated by performing the high temperature processing, the plasma irradiation is performed on the single crystal silicon carbide (SiC) substrate before the high temperature processing is performed, and thus it is possible to reduce the formation of factors for degrading the flatness of the surface of the substrate, such as step bunching or pits.

As described above, in the present invention, it is important to perform the plasma irradiation processing before the high temperature heating processing such as the annealing processing; it is not essential to etch the substrate by performing the plasma irradiation processing. In the present invention, in the stage preceding the high temperature heating processing, the plasma irradiation is performed on the silicon carbide (SiC) substrate before the high temperature heating processing so that the surface of the substrate is processed to minimize the formation of the factors for degrading the flatness caused by the high temperature heating processing, that is, the front-end process for reducing the surface roughness caused by the high temperature heating processing is performed before the high temperature heating processing. In other words, the plasma irradiation is performed so as to remove at least part of a substance (for example, an impurity such as silicon oxide carbide (SiOC) adhering to or formed on the substrate) other than the crystalline silicon carbide (SiC) substrate which is present on the surface of the crystalline silicon carbide (SiC) substrate. Whether part of the crystalline silicon carbide (SiC) substrate is etched (for example, example 1) or is not etched by the plasma irradiation (for example, examples 2 to 5), if at least part of the substance, that is, the impurity can be removed, the factors for the surface roughness are reduced, and this results in reducing the generation of step bunching and pits.

In other words, in the present invention, it is important to perform the plasma irradiation on the substrate in the stage preceding the high temperature heating processing on the silicon carbide (SiC) substrate; before the high temperature heating processing, by the plasma irradiation, the processing for reducing the generation of the factors for degrading the flatness caused by the high temperature heating processing is previously performed on the silicon carbide (SiC) substrate. In the present invention, as described in examples 2 to 5, even if the amount of etching of the silicon carbide (SiC) substrate by the plasma irradiation is substantially zero, the degradation of the surface flatness of the substrate surface is suppressed after the high temperature heating processing. As described above, in the present invention, it is not essential to perform the plasma irradiation to etch the substrate; the plasma irradiation of the present invention is performed before the high temperature heating processing so as to previously reduce the surface roughness and the formation of pits on the substrate surface before the surface roughness and the formation of pits caused by the high temperature heating processing are produced.

As described above, the present invention is fundamentally different from the invention for removing, by etching, the change in the surface shape such as step bunching that has already been formed after the high temperature annealing processing, and the factors for causing step bunching and pits are removed by the plasma irradiation before the heating processing (such as the annealing processing). In other words, the present invention does not remove one region on the silicon carbide (SiC) substrate by etching through plasma. Hence, as in example 1, even if the amount of etching by the plasma irradiation performed before the heating processing is reduced to 20 nm, it is possible to reduce the formation of step bunching and pits on the surface after the heating processing. Moreover, as in examples 2 to 5, even if the amount of etching by the plasma irradiation is reduced to 0 nm, it is possible to reduce the formation of step bunching and pits on the surface after the heating processing.

According to the present invention, since the amount of cutting by etching for reduction in surface roughness can be reduced or reduced to zero, it is possible to achieve low cost.

Although the preferred embodiment of the present invention has been described above with reference to the accompanying drawings, the present invention is not limited to such an embodiment, and many modifications are possible in the technical scope grasped from the scope of claims. The present invention is not limited by the above embodiment; many modifications and variations are possible without departing from the spirit and scope of the invention.

The invention claimed is:

1. A method of processing a crystalline silicon carbide (SiC) substrate, the method comprising:
    a step of removing an oxide film formed on the crystalline silicon carbide (SiC) substrate in which an impurity atom is ion-implanted;
    a step of performing plasma irradiation using a gas containing at least one of an inert gas and a fluorine based gas on the crystalline silicon carbide (SiC) substrate in which the oxide film is removed; and
    a step of performing high temperature heating processing on the plasma-irradiated crystalline silicon carbide (SiC) substrate.

2. The substrate processing method according to claim 1, wherein the crystalline silicon carbide (SiC) substrate includes an epitaxial silicon carbide (SiC) crystalline layer as a surface layer.

3. The substrate processing method according to claim 1, wherein the gas is any of argon gas, carbon tetrafluoride gas and a mixed gas of argon gas and carbon tetrafluoride gas.

4. The substrate processing method according to claim 1, wherein the impurity atom is any of nitrogen (N), phosphorus (P), aluminum (Al) and boron (B).

5. The substrate processing method according to claim 1, wherein the high temperature heating processing is performed by a device of a high-frequency induction heating method, an electron bombardment heating method or a resistance heating method.

6. A method of manufacturing a crystalline silicon carbide (SiC) substrate, the method comprising:

a step of preparing a crystalline silicon carbide (SiC) substrate in which a predetermined impurity atom is ion-implanted;

a step of removing an oxide film formed on the crystalline silicon carbide (SiC) substrate;

a step of performing plasma irradiation using a gas containing at least one of an inert gas and a fluorine based gas on the crystalline silicon carbide (SiC) substrate in which the oxide film is removed; and a step of performing high temperature heating processing on the plasma-irradiated crystalline silicon carbide (SiC) substrate.

7. The method of manufacturing a crystalline silicon carbide (SiC) substrate according to claim 6, wherein the crystalline silicon carbide (SiC) substrate is a single crystal silicon carbide (SiC) substrate.

8. The method of manufacturing a crystalline silicon carbide (SiC) substrate according to claim 7, wherein the single crystal silicon carbide (SiC) substrate includes an epitaxial silicon carbide (SiC) crystalline layer as a surface layer.

9. The method of manufacturing a crystalline silicon carbide (SiC) substrate according to claim 6, wherein the gas is any of argon gas, carbon tetrafluoride gas and a mixed gas of argon gas and carbon tetrafluoride gas.

10. The method of manufacturing a crystalline silicon carbide (SiC) substrate according to claim 6, wherein the step of preparing the silicon carbide (SiC) substrate includes a step of ion-implanting the predetermined impurity atom into the crystalline silicon carbide (SiC) substrate.

11. The method of manufacturing a silicon carbide (SiC) substrate according to claim 10, wherein the step of preparing the crystalline silicon carbide (SiC) substrate further includes, before the step of ion-implanting, a step of performing sacrificial oxidation on a portion including a surface of the crystalline silicon carbide (SiC) substrate to form a buffer layer for the ion implantation.

12. A method of manufacturing a crystalline silicon carbide (SiC) substrate, the method comprising:

a step of preparing a crystalline silicon carbide (SiC) substrate in which a predetermined impurity atom is ion-implanted;

a step of removing, from the crystalline silicon carbide (SiC) substrate, an oxide film formed thereon;

a step of performing plasma irradiation on the crystalline silicon carbide (SiC) substrate so as to remove at least part of a substance, other than the crystalline silicon carbide (SiC) substrate, the substance being present on a surface of the crystalline silicon carbide (SiC) substrate in which the oxide film is removed; and a step of performing high temperature heating processing on the plasma-irradiated crystalline silicon carbide (SiC) substrate.

* * * * *